United States Patent
Sato

(10) Patent No.: US 10,966,350 B2
(45) Date of Patent: Mar. 30, 2021

(54) COOLING SYSTEM

(71) Applicant: FUJITSU LIMITED, Kawasaki (JP)

(72) Inventor: Yoichi Sato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/656,786

(22) Filed: Oct. 18, 2019

(65) Prior Publication Data

US 2020/0211925 A1 Jul. 2, 2020

(30) Foreign Application Priority Data

Dec. 28, 2018 (JP) .............................. JP2018-246946

(51) Int. Cl.
*H05K 7/20* (2006.01)
*G06F 1/20* (2006.01)

(52) U.S. Cl.
CPC ......... *H05K 7/203* (2013.01); *H05K 7/20309* (2013.01); *G06F 1/20* (2013.01); *H01L 2924/0002* (2013.01); *H05K 7/20327* (2013.01)

(58) Field of Classification Search
CPC ..... G06F 1/20; H01L 23/427; H01L 23/4332; H05K 7/20236; H05K 7/203; H05K 7/20309; H05K 7/20327
See application file for complete search history.

(56) References Cited

U.S. PATENT DOCUMENTS

| 4,787,843 | A | * | 11/1988 | Huffman | ................. C30B 15/14 |
| | | | | | 165/104.27 |
| 5,089,218 | A | * | 2/1992 | Gardner | ................... G21C 1/09 |
| | | | | | 376/283 |
| 5,373,417 | A | * | 12/1994 | Barrett | .................... H01L 23/42 |
| | | | | | 165/80.4 |
| 2015/0184949 | A1 | | 7/2015 | So et al. | |
| 2017/0055356 | A1 | * | 2/2017 | Kristensen | ............ H05K 5/068 |
| 2017/0280577 | A1 | * | 9/2017 | Laneryd | .................. H01F 27/14 |
| 2017/0295670 | A1 | * | 10/2017 | Campbell | .......... H05K 7/20236 |
| 2018/0020570 | A1 | * | 1/2018 | Fujiwara | ........... H05K 7/20418 |
| 2018/0042138 | A1 | * | 2/2018 | Campbell | ............. H05K 7/203 |
| 2018/0084670 | A1 | * | 3/2018 | Hirai | .................. H05K 7/20236 |
| 2019/0014685 | A1 | * | 1/2019 | So | ..................... H05K 7/20809 |

FOREIGN PATENT DOCUMENTS

| JP | 2005-259747 | 9/2005 |
| JP | 2007-294655 | 11/2007 |
| JP | 2015-144247 | 8/2015 |
| JP | 2016-099079 | 5/2016 |

* cited by examiner

*Primary Examiner* — Jacob R Crum
(74) *Attorney, Agent, or Firm* — Fujitsu Patent Center

(57) ABSTRACT

A cooling system includes: an evaporator configured to evaporate coolant by receiving heat of a heating device; a heat radiator configured to radiate heat of the coolant; a circulation passage through which the coolant circulates between the evaporator and the heat radiator; a pump that is provided in the circulation passage and is configured to circulate the coolant through the circulation passage; and an expandable device that is provided in the circulation passage and has expandable inner space into which the coolant flows, wherein the evaporator, the heat radiator, the circulation passage and the inner space are fully filled with the coolant.

9 Claims, 13 Drawing Sheets

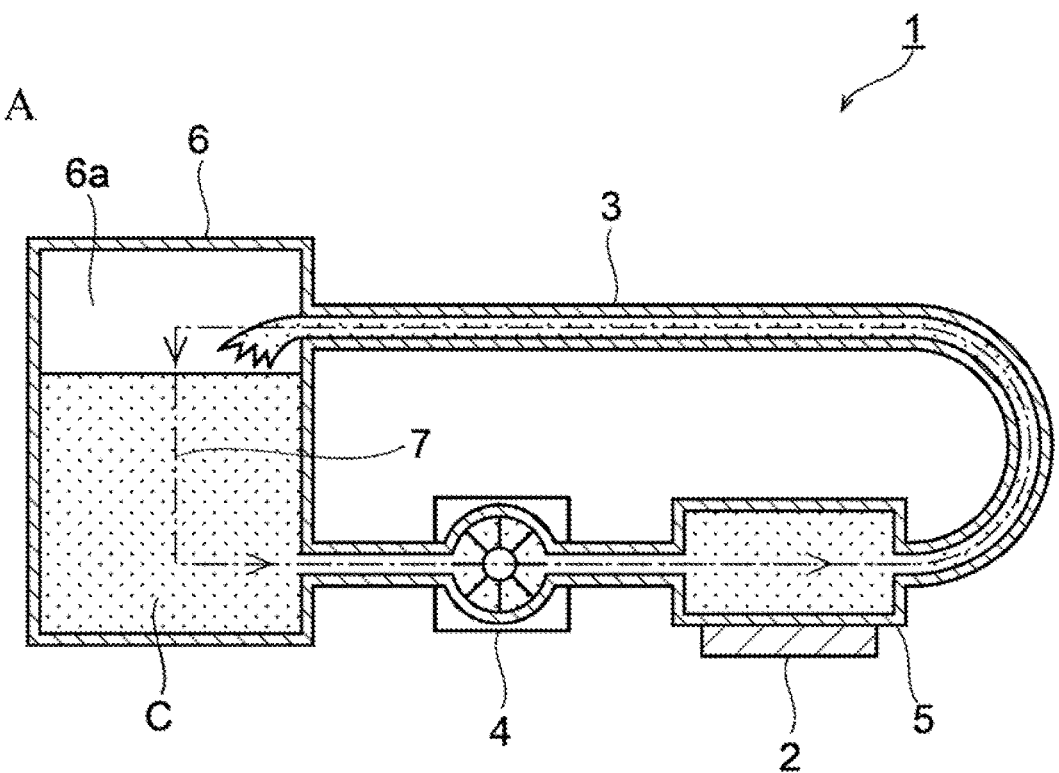
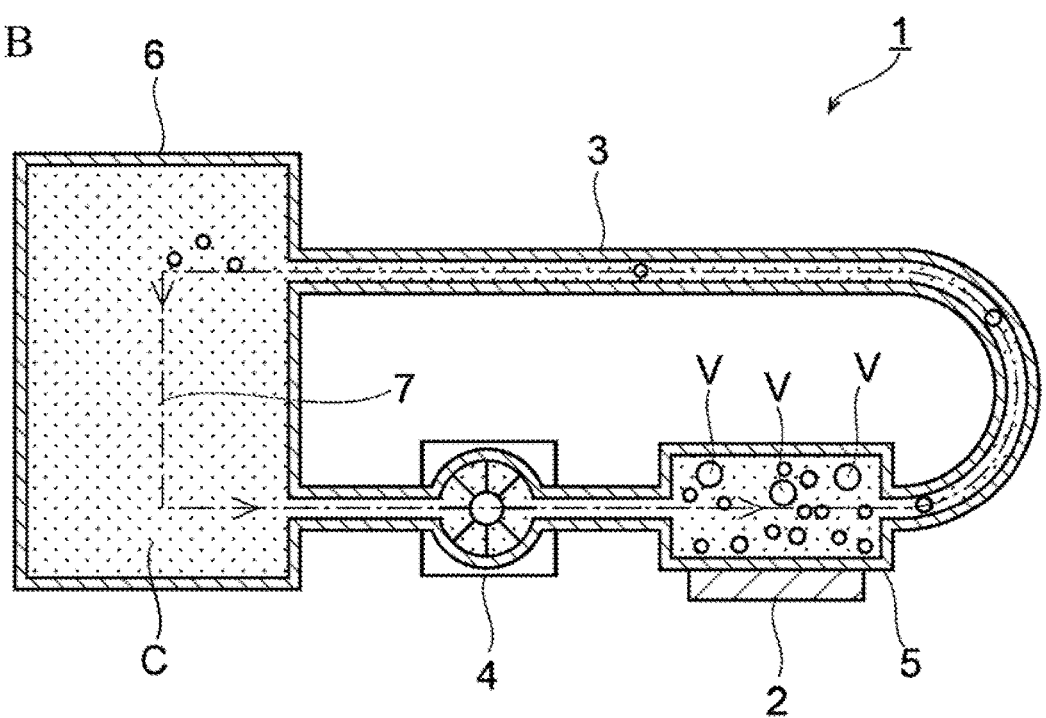

COOLING SYSTEM

CROSS-REFERENCE TO RELATED APPLICATION

This application is based upon and claims the benefit of priority of the prior Japanese Patent Application No. 2018-246946, filed on Dec. 28, 2018, the entire contents of which are incorporated herein by reference.

FIELD

A certain aspect of embodiments described herein relates to a cooling system.

BACKGROUND

There are various types of cooling systems for cooling a heating device such as an LED (Light Emitting Diode), an LD (Laser Diode) or a CPU (Central Processing Unit). A cooling system, in which a pump circulates coolant cools a heating device by liquid coolant when a temperature of the heating device is low and cools the heating device by vaporization heat of the coolant when the temperature of the heating device is high.

The heat of the heating device is transferred to the cooling system when the pump circulates the coolant. It is therefore possible to effectively cool the heating device.

However, there is morn for improvement in a point of stably cooling the heating device.

SUMMARY

According to an aspect of the present invention, there is provided a cooling system including; an evaporator configured to evaporate coolant by receiving heat of a heating device; a heat radiator configured to radiate heat of the coolant; a circulation passage through which the coolant circulates between the evaporator and the heat radiator; a pump that is provided in the circulation passage and is configured to circulate the coolant through the circulation passage; and an expandable device that is provided in the circulation passage and has expandable inner space into which the coolant flows, wherein the evaporator, the heat radiator, the circulation passage and the inner space are fully filled with the coolant The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1A illustrates a diagram of a cooling system 1;
FIG. 1B illustrates a diagram of a cooling system in a case where a temperature of a heating device is higher than a boiling point of coolant.

DESCRIPTION OF EMBODIMENTS

Figure 2A:
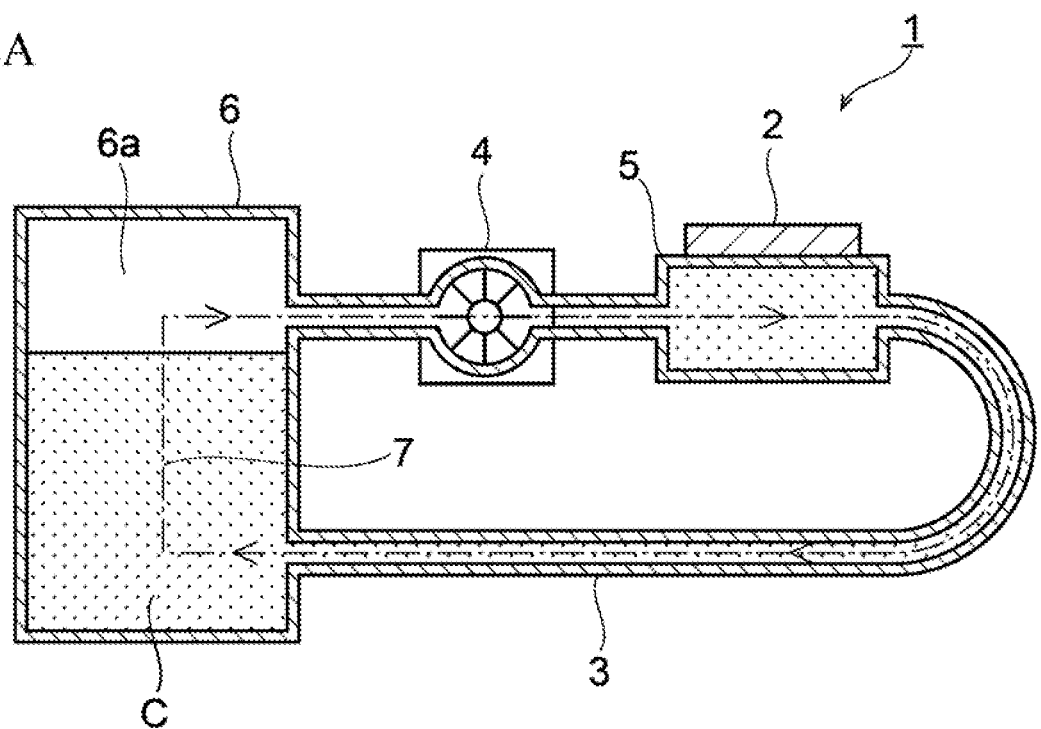
FIG. 2A and FIG. 2B illustrate diagrams of a cooling system in order to explain problems.

Before embodiments, a description will be given of matters reviewed by the present inventors.

Heating devices such as an LED, an LD, or a CPU are provided in an electronic device. In particular, it is preferable that the heating devices are effectively cooled in spite of posture of the electronic device for use, in an electronic device such as a portable projector, or a server of which posture is not fixed for setting.

FIG. 1A illustrates a diagram of a cooling system 1 used in such an electronic device.

The cooling system 1 cools a heating device 2 such as an LED, an LD or a CPU. The cooling system 1 has a circulation passage 3 through which coolant C circulates. The circulation passage 3 has a pump 4, an evaporator 5 and a heat radiator 6.

The pump 4 circulates the coolant C through the circulation passage 3. The pump 4 generates flow 7 of the coolant C in the circulation passage 3. The evaporator 5 is made of a metal such as copper having favorable heat conductivity. The heating device 2 is fixed to an external surface of the evaporator 5. The heat radiator 6 cools the coolant C by heat exchange with external atmosphere. In the heat radiator 6, decompression space 6a for housing the coolant C of which a volume is increased by vaporization is formed in advance.

The coolant C is not limited. In this example, water is used as the coolant C. Pressure in the circulation passage 3 is kept lower than that of the normal atmosphere. In this case, the coolant C vaporizes at a temperature lower than a boiling point in the normal atmosphere.

Next, a description will be given of an operation of the cooling system 1.

When the cooling system 1 is provided in a portable electronic device such as a projector, posture of the cooling system 1 for use is various.

In the example of FIG. 1A, the cooling system 1 is provided so that the pump 4 is under the decompression space 6a. It is assumed that the temperature of the heating device 2 is lower than the boiling point of the coolant C, and the coolant C does not boil in the evaporator 5.

In this case, the coolant C does not boil in the evaporator 5. The heating device 2 is cooled by the liquid coolant C supplied by the pump 4. The volume of the coolant C does not greatly increase because the coolant C does not boil. The decompression space 6a is maintained in the heat radiator 6.

On the other hand, FIG. 1B illustrates a diagram of the cooling system 1 in a case where the temperature of the heating device 2 is higher than the boiling point of the coolant C.

In this case, the coolant C boils in the evaporator 5. Thus, vapor V of the coolant C is generated. In this case, the volume of the coolant C increases. However, the increased volume is absorbed by the decompression space 6a of the heat radiator 6. It is therefore possible to prevent that the pressure in the circulation passage 3 becomes high because of the vapor V.

In this manner, in the cooling system 1, the liquid coolant C does not fully fill the heat radiator 6. In this case, when the decompression space 6a in which the liquid coolant C does not exist is provided in the heat radiator 6, the increasing of the volume of the boiling coolant C can be absorbed.

However, the present inventors have found that the posture of the cooling system 1 causes the following problems.

Figure 2B:
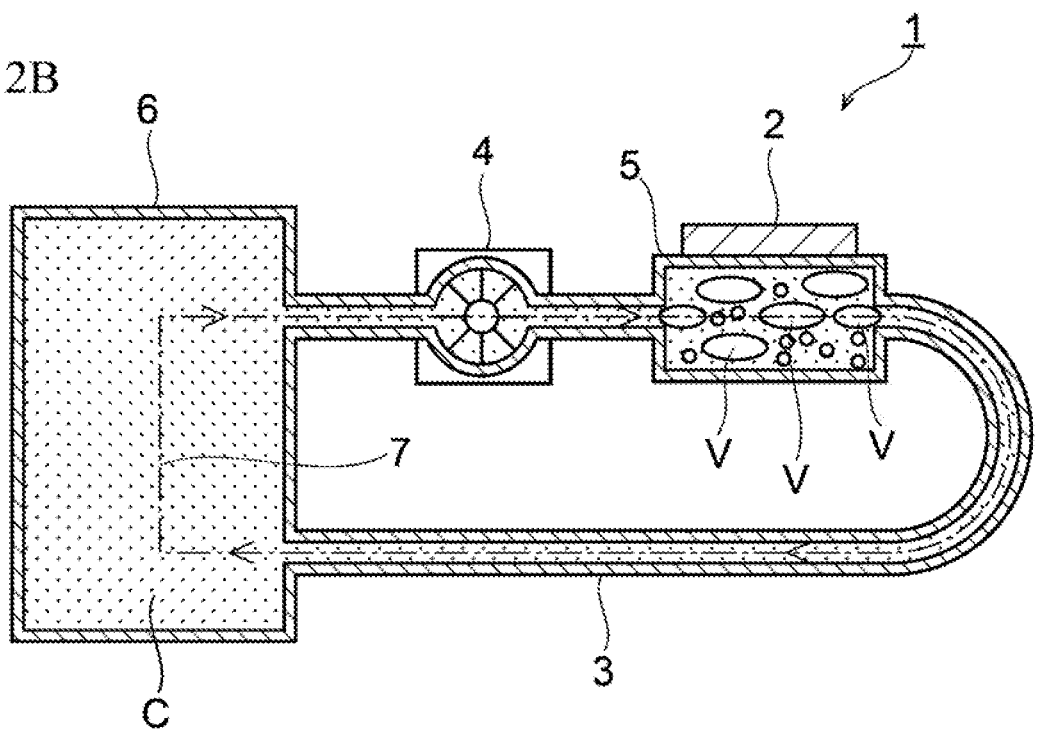

FIG. 2A and FIG. 2B illustrate diagrams of the cooling system 1 in order to explain the problems.

FIG. 2A illustrates a case where the cooling system 1 is used upside down, and the position of the decompression space 6a is approximately the same as that of the pump 4 in the height direction. It is assumed that the temperature of the heating device 2 is lower than the boiling point of the coolant C, and the coolant C does not boil in the evaporator 5.

In this case, the decompression space 6a extends to the pump 4. And, the liquid coolant C is not supplied to the pump 4. Therefore, the pump 4 idles, and the coolant C does not circulate. Therefore, the liquid coolant C remains in the evaporator 5.

When the condition is left, the temperature of the heating device 2 increases. When the temperature of the heating device 2 exceeds the boiling point of the coolant C, the vapor V temporally occurs as illustrated in FIG. 2B. Thus, the volume of the coolant C temporally increases, and the decompression space 6a disappears. The pump 4 can supply the coolant C. However, when a given time passes, the heating device 2 is cooled and the occurrence of the vapor V is suppressed. Therefore, as illustrated in FIG. 2A, the pump 4 idles. And the coolant C cannot cool the heating device 2.

In this manner, in the cooling system 1, the pump 4 may idle in accordance with the posture of the cooling system 1. Therefore, cooling efficiency may be remarkably degraded.

A description will be given of embodiments.

Figure 3:
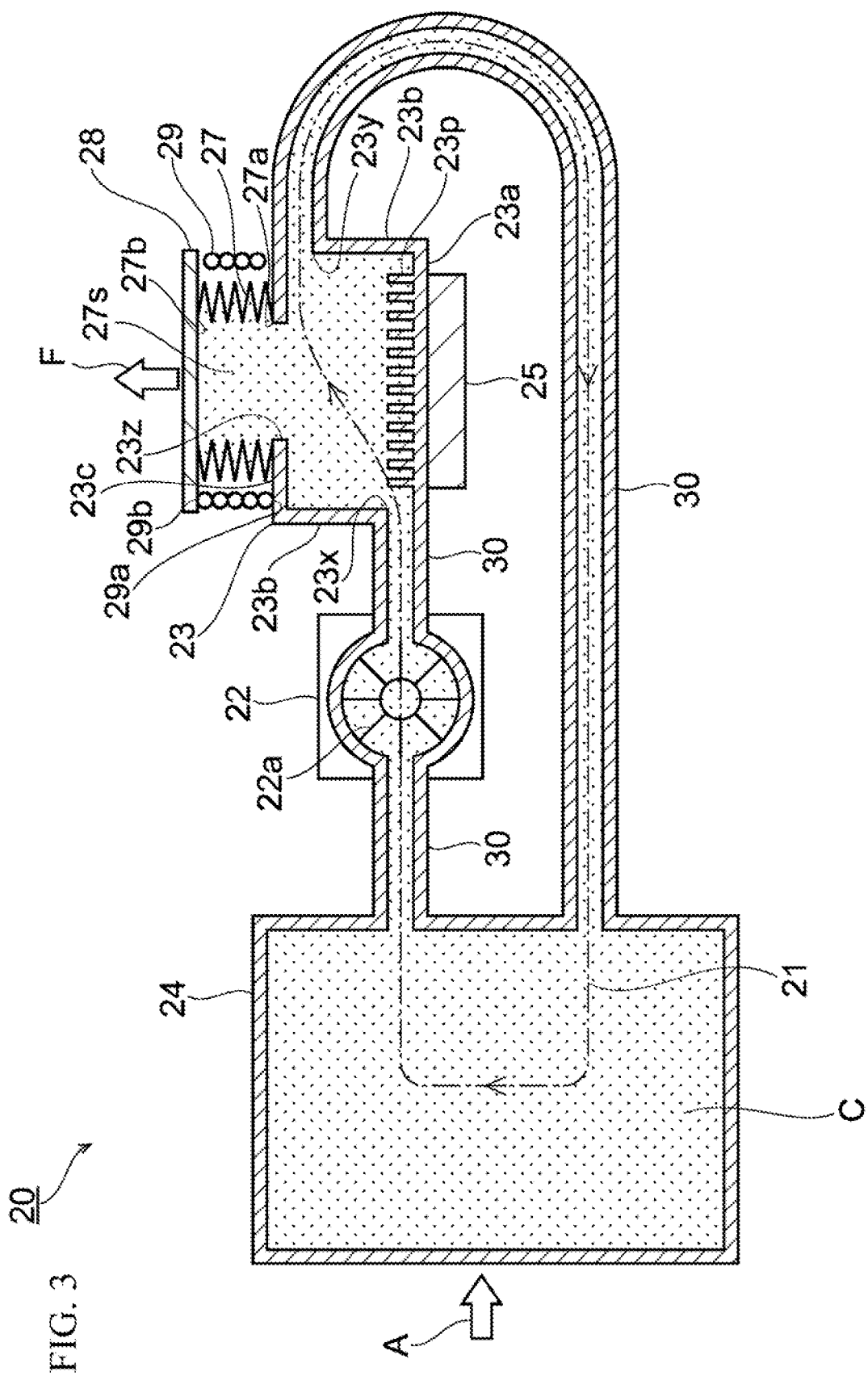
FIG. 3 illustrates a diagram of a cooling system in accordance with a first embodiment.

(First Embodiment) FIG. 3 illustrates a diagram of a cooling system in accordance with a first embodiment.

A cooling system 20 of the first embodiment is provided in an electronic device of which posture is various for use, such as a portable projector, or a server which may be vertically located or horizontally located. The cooling system 20 has a circulation passage 30 through which the coolant C circulates.

The circulation passage 30 is a metal pipe such as copper or stainless steel. The circulation passage 30 is connected with each of a pump 22, an evaporator 23 and a heat radiator 24.

The pump 22 circulates the coolant C through the circulation passage 30. The pump 22 generates flow 21 of the coolant C circulating through the circulation passage 30 in a unidirection. In the embodiment, a plurality of blades 22a rotating at a constant rotation speed are provided in the pump 22. The plurality of blades 22a send the liquid coolant C to the evaporator 23.

The evaporator 23 is a box type container of which inner space is demarked by a bottom plate 23a, side plates 23b and a top plate 23c. The material of the evaporator 23 may be copper having high heat conductivity.

A heating device 25 to be cooled is fixed to the bottom plate 23a. The heating device 25 is an electronic device which generates heat during operation. The heating device 25 is such as an LED, an LD, or a CPU. In the embodiment, a plurality of pins 23p stand on the bottom plate 23a. Thereby, a surface area of the bottom plate 23a increases. Thus, the heat exchange between the coolant C and the bottom plate 23a is promoted.

A supply port 23x and an exhaust port 23y are provided in the side plates 23b. The supply port 23x is an opening for supplying the coolant C to the evaporator 23. The exhaust port 23y is an opening for exhausting the coolant C from the evaporator 23. The positions of the supply port 23x and the exhaust port 23y are not limited. These positions can be optionally determined.

On the other hand, an opening 23z is provided in the top plate 23c. One end 27a of the bellows 27 is fixed to the top plate 23c around the opening 23z. The bellows 27 is an example of an expandable device. The bellows 27 has expandable inner space 27s communicating with the circulation passage 30. A material of the bellows 27 is not limited. For example, the bellows 27 is made of a metal such as copper, brass, or stainless steel.

The top plate 23c acts as a base member to which the one end 27a of the bellows 27 is fixed.

A plate 28 is fixed to the other end 27b of the bellows 27. The plate 28 is a metal plate for sealing the bellows 27 at the other end 27b. In a cross section, a width of the plate 28 is larger than the width of the bellows 27.

A spring 29 is provided out of the bellows 27. The spring 29 is an example of a biasing device. A first end 29a of the spring 29 is fixed to the top plate 23c. A second end 29b is fixed to the plate 28.

In the embodiment, a coil spring is used as the spring 29. The spring 29 is co-axially provided with the bellows 27. In the condition of FIG. 3, the spring 29 is compressed to a length which is shorter than a natural length of the spring 29. Thus, biasing force F is applied to the bellows 27 in a direction in which the inner space 27s expands.

On the other hand, the heat radiator 24 cools the coolant C by exchanging with outer atmosphere A. Cooling air of an air conditioner may be used as the outer atmosphere A. The cooling air may be applied to the heat radiator 24. A water cooling tube through which coolant water flows may be rolled around the heat radiator 24. And the heat radiator 24 may be cooled by the coolant water.

Being different from FIG. 1A, in the embodiment, the decompression space is not provided in the heat radiator 24. At a time when the cooling system 20 is manufactured, the liquid coolant C fully fills the evaporator 23, the heat radiator 24, the inner space 27s of the bellows 27 and the circulation passage 30. Thus, it is not necessary to adjust the filling rate of the coolant C the cooling system 20. And it is easy to manufacture the cooling system 20.

The coolant C is not limited. In the embodiment, water is used as the coolant C. The coolant C may be such as alcohol, or solution.

The pressure in the circulation passage 30 is lower than the atmospheric pressure. Therefore, the coolant C boils at a temperature lower than the boiling point in the normal atmosphere. In the embodiment, the pressure in the circulation passage 30 is 0.01 MPa to 0.04 MPa. The boiling point of the coolant C is adjusted to 47 degrees C. to 50 degrees C. Thus, the coolant C boils at the temperature of the heating device 25 during generating heat. Therefore, the cooling efficiency of the cooling system 20 is improved.

The filling method of the coolant C into the circulation passage 30 is not limited. For example, a supply port is provided in the circulation passage 30. And, the pressure in the circulation passage 30 is reduced through the supply port. Bubbles are removed from the coolant C in decompressed state in advance. When the coolant C is injected into the circulation passage 30 via the supply port, the circulation passage 30 is fully filled with the coolant C. The circulation passage 30 is fully filled only with the liquid coolant C without bubbles, under a condition that the heating device 25 does not generate heat and the temperature is the room temperature.

Next, a description will be give of details of the evaporator 23 and the bellows 27.

Figure 4A:
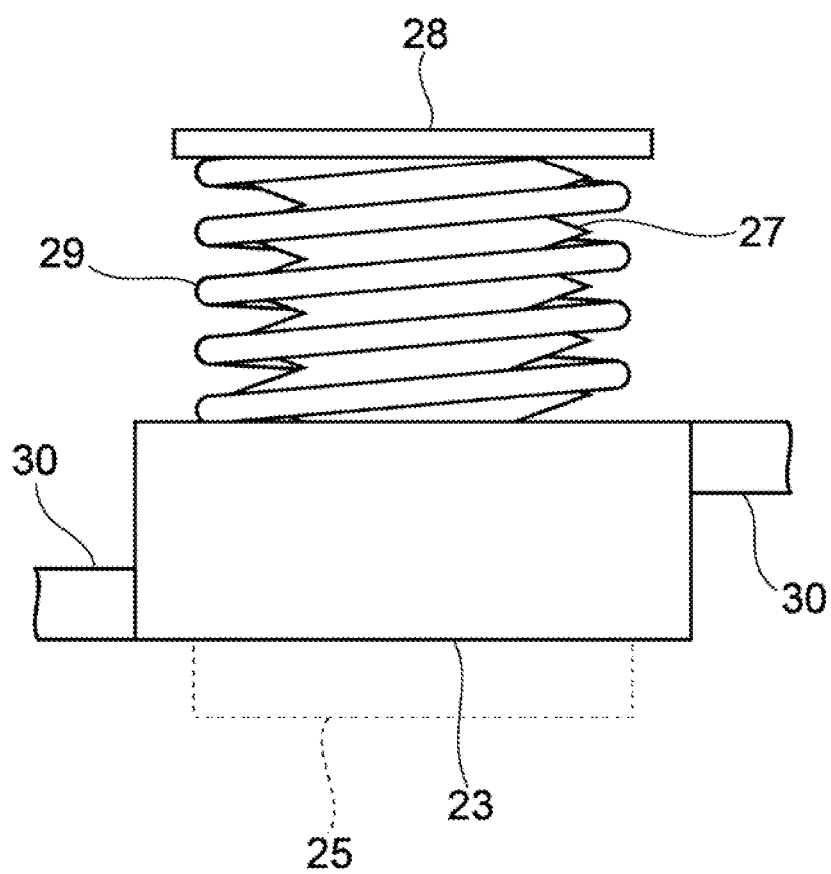
FIG. 4A illustrates a side view of an evaporator and a bellows in accordance with a first embodiment.

FIG. 4A illustrates a side view of the evaporator 23 and the bellows 27.

As illustrated in FIG. 4A, in the side view, the evaporator 23 has a rectangular shape.

Figure 4B:
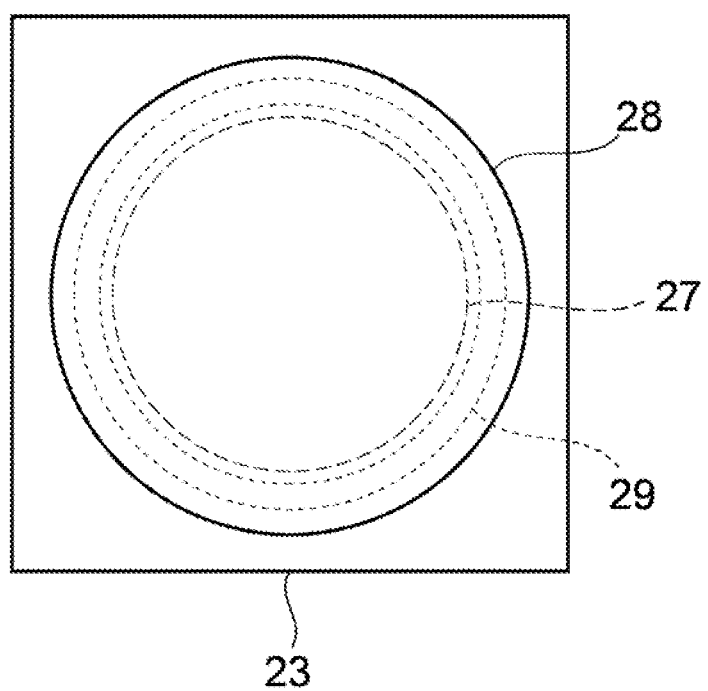
FIG. 4B illustrates a top view of an evaporator and a bellows in accordance with a first embodiment.

FIG. 4B illustrates a top view of the evaporator 23 and the bellows 27.

A size of the evaporator 23 is designed in accordance with the size of the heating device 25. In the embodiment, the evaporator 23 has a square shape of which one side has approximately 50 mm when seen from a top view.

The plate 28 approximately has a circular shape, when seen from a top view. The plate 28 has a size to cover the bellows 27 and the spring 29.

Figure 5A:
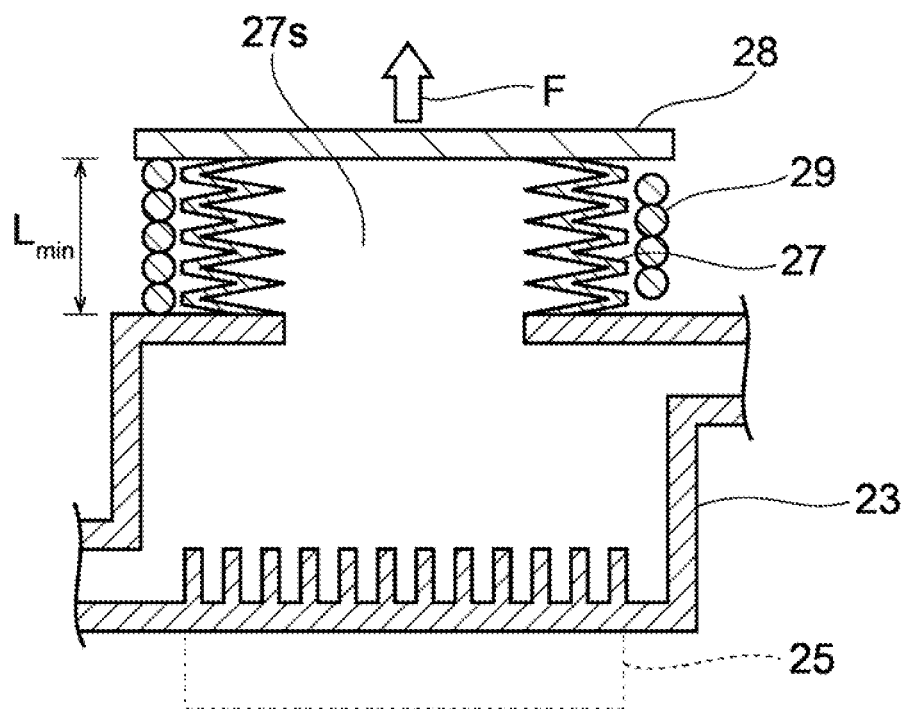
FIG. 5A illustrates a cross sectional view of a bellows having a minimum length and an evaporator in a first embodiment.

FIG. 5A illustrates a cross sectional view of the bellows 27 having the minimum length $L_{min}$ and the evaporator 23.

Just after manufacturing the cooling system 20, the length of the bellows 27 is a minimum length $L_{min}$. And, the inner space 27s of the bellows 27 is fully filled with the liquid coolant C. The pressure applied to the bellows 27 by the biasing force F is slightly higher than the atmospheric pressure. The pressure may be 0.1 MPa to 0.2 MPa. When the coolant C boils in the evaporator 23, the spring 29 supports expanding of the bellows 27 against the atmospheric pressure. Moreover, vaporization of the coolant C can be promoted by the biasing force F in the expansion direction of the inner space 27s.

Figure 5B:
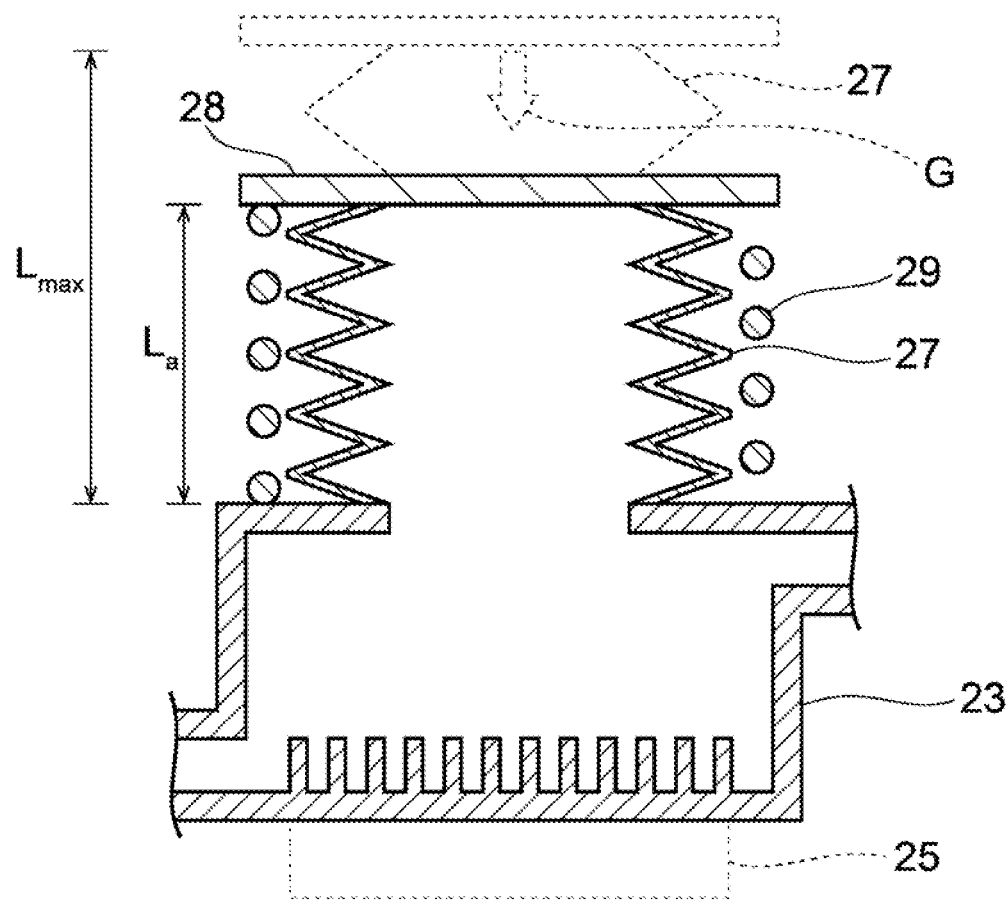
FIG. 5B illustrates a cross sectional view of a bellows and an evaporator in a case where a length of a bellows is equal to an allowed length in a first embodiment.

FIG. 5B illustrates a cross sectional view of the bellows 27 and the evaporator 23 in a case where the length of the bellows 27 is equal to an allowed length.

The bellows 27 repeats expansion and contraction by elastic deformation. When the bellows 27 is excessively expanded, the length of the bellows 27 does not return to the initial length. Alternatively, the sealing performance may be degraded. Therefore, an allowed length $L_a$ is set in the bellows 27 by a manufacturing company or the like. The allowed length $L_a$ is between the minimum length $L_{min}$ and the maximum length $L_{max}$ of the bellows 27. With respect to the length, the manufacturing company guarantees the performance.

In the embodiment, when the length of the bellows 27 is equal to the allowed length $L_a$, the length of the spring 29 is equal to the natural length. Thus, when the bellows 27 expands to a length exceeding the allowed length $L_a$, force G against the expanding is applied to the bellows 27 from the spring 29. The deformation of the bellows 27 exceeding the allowed length $L_a$ is suppressed.

Next, a description will be given of the cooling system 20.

Figure 6A:
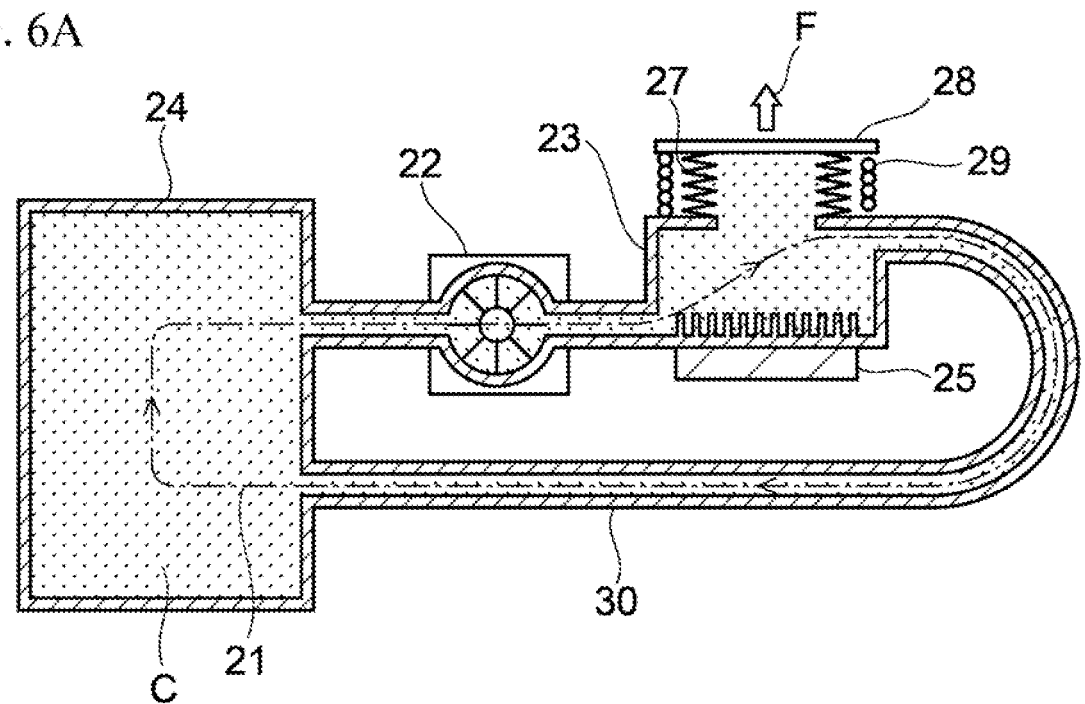
FIG. 6A and FIG. 6B schematically illustrates operation of a cooling system in accordance with a first embodiment.
Figure 6B:
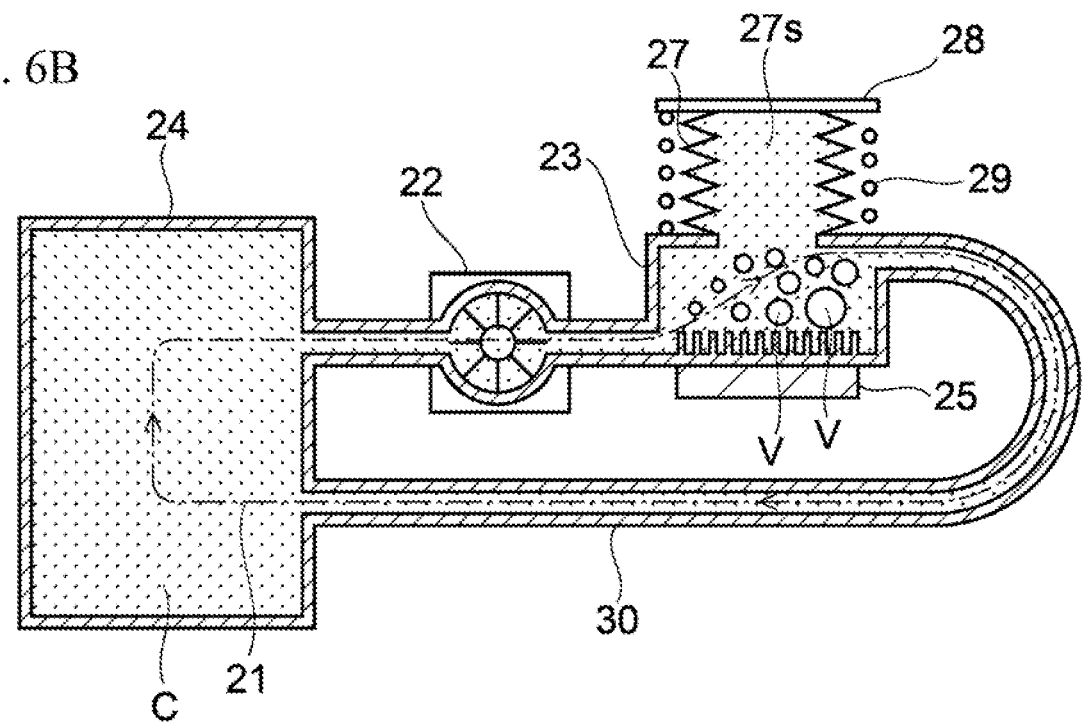

FIG. 6A and FIG. 6B schematically illustrates the operation of the cooling system of the embodiment.

In the example of FIG. 6A, it is assumed that the temperature of the heating device 25 is lower than the boiling point of the coolant C in the evaporator 23, and the coolant C does not boil in the evaporator 23.

In this case, the size of the bellows 27 is the smallest, as well as the size just after manufacturing. The coolant C is liquid in every portion in the cooling system 20. Therefore, the vapor of the coolant C does not make the pump 22 idle. Therefore, the heating device 25 is stably cooled by the liquid coolant C sent by the pump 22.

The biasing force F is applied to the bellows 27 by the spring 29. However, the volume changing of the liquid coolant C subjected to the outer pressure is small. Therefore, the expansion of the bellows 27 caused by the biasing force F hardly occurs.

On the other hand, in the example of FIG. 6B, the temperature of the heating device 25 is higher than the boiling point of the coolant C in the evaporator and the coolant C boils in the evaporator 23.

In this case, the vapor V of the coolant C is generated by boiling. The total volume of the vapor coolant C and the liquid coolant C increases. Therefore, the bellows 27 expands, and the inner space 27s expands. The coolant C flows into the inner space 27s. In particular, in the example, the spring 29 supports the expansion of the bellows 27. Therefore, the inner space 27s rapidly expands when the vapor V is generated. The generation of the vapor V is promoted. The spring 29 may be omitted when the bellows 27 is sufficiently flexible and can expand by itself.

The vapor V is cooled in the heat radiator 24 before reaching the pump 22 and returns to liquid. It is therefore possible to suppress idling of the pump 22 caused by the vapor V.

In particular, in the example, the bellows 27 is provided in the evaporator 23 in which the volume changing of the coolant C is large because of the vapor V. Therefore, the bellows 27 speedily absorbs the volume changing of the coolant C.

Moreover, the structure of the bellows 27 and the spring 29 is simple. It is therefore possible to make the cooling system 20 without increasing of the number of parts and complicating of the manufacturing process.

As mentioned above, in the embodiment, the bellows 27 expanding or contracting in accordance with the volume increasing of the coolant C is provided. It is therefore not necessary to provide decompression space for housing an increased volume amount of the coolant C, in the heat radiator 24.

It is therefore possible to fully fill the whole of the cooling system 20 with the liquid coolant C. It is possible to suppress expansion of decompression space, in which the coolant C does not exist, to the pump 22. In this case, the liquid coolant C contacts with the pump 22, regardless of the posture of the cooling system 20. Therefore, the pump 22 can send the coolant C without fail. And, it is possible to stably cool the heating device 25.

(Second Embodiment) In the first embodiment, as illustrated in FIG. 5A, the bellows 27 is biased by the biasing force F caused by the extension of the compressed spring 29. In the second embodiment, the bellows 27 is biased by a different method.

Figure 7:
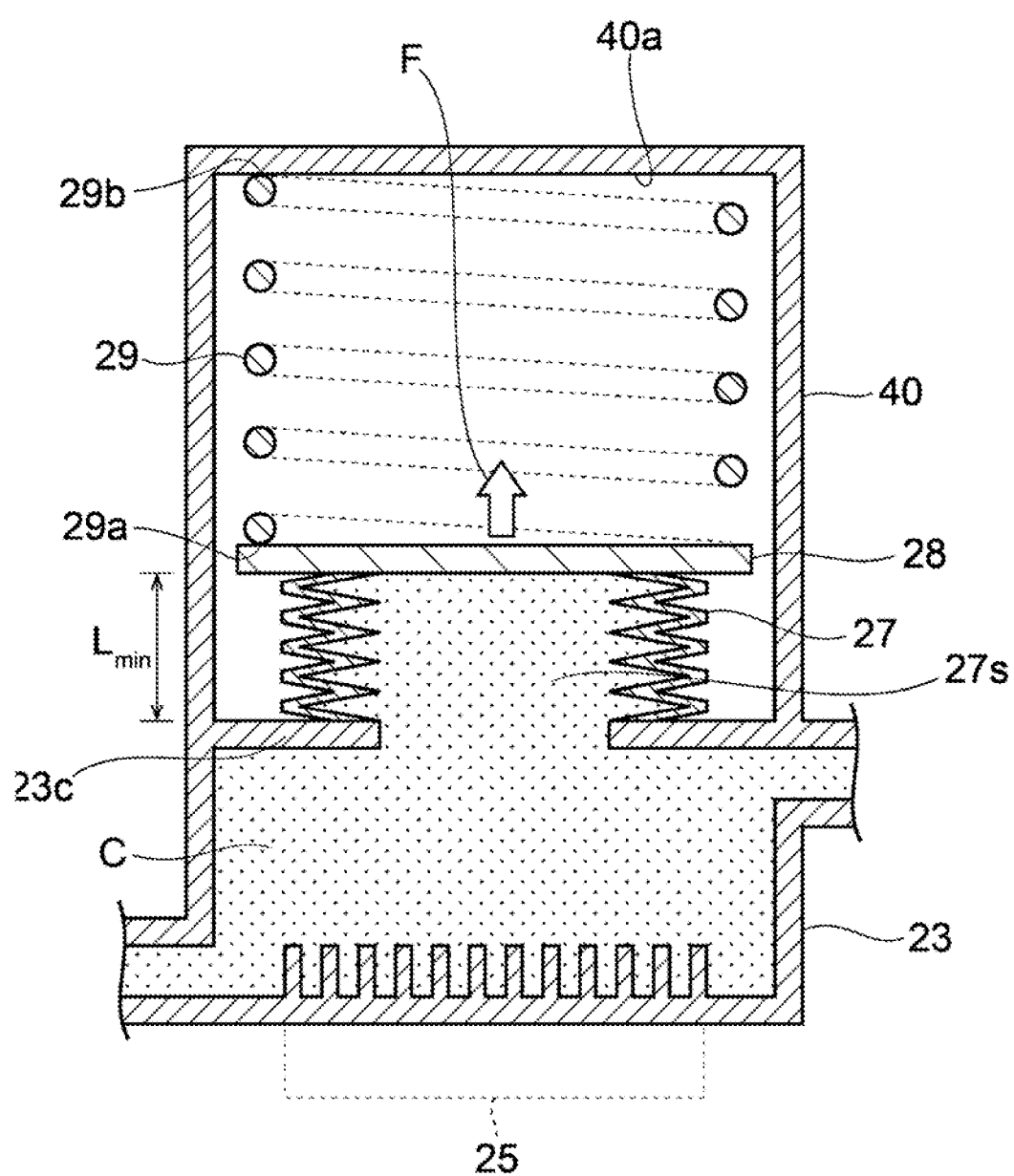
FIG. 7 illustrates a cross sectional view of a bellows of a second embodiment and the vicinity.

FIG. 7 illustrates a cross sectional view of the bellows 27 of the second embodiment and the vicinity.

In FIG. 7, the same numerals are added to the elements as those of the first embodiment. And explanations of the same elements are omitted.

As illustrated in FIG. 7, in the embodiment, a cover 40 is provided on the top plate 23c of the evaporator 23. The bellows 27 and the spring 29 are housed in the cover 40. A material of the cover 40 is not limited. The cover 40 may be made of copper as well as the top plate 23c. The cover 40 may be made of resin such as plastic.

The cover 40 has an internal face 40a facing with the plate 28. The first end 29a of the spring 29 is fixed to the plate 28. The second end 29b of the spring 29 is fixed to the internal face 40a.

FIG. 7 illustrates a case where the temperature of the heating device 25 is low, and the vapor V of the coolant C is not generated in the evaporator 23. In the case, the length of the bellows 27 is the minimum length $L_{min}$. The spring 29 is extended more than the natural length. The biasing force F in the expansion direction of the inner space 27s of the bellows 27 is applied to the bellows 27.

Figure 8:
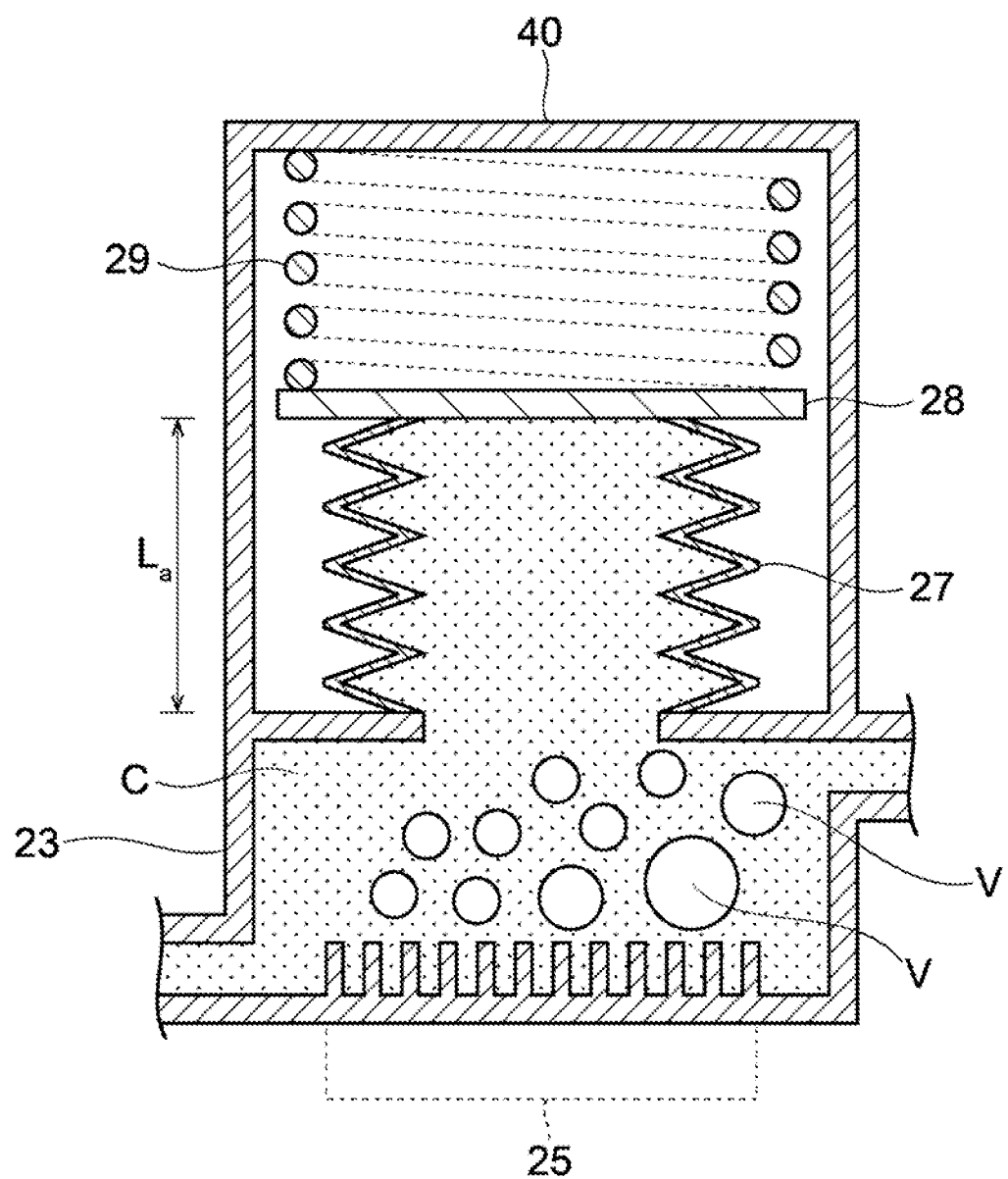
FIG. 8 illustrates a bellows 27 and the vicinity in accordance with a second embodiment in cased where vapor is generated by heat of a heating device.

FIG. 8 illustrates the bellows 27 and the vicinity. In this case, the vapor V is generated because of the heat of the heating device 25.

In this case, the inner space 27s of the bellows 27 expands in accordance with increasing of the volume of the coolant C caused by the vapor V. The increased volume amount of the coolant C is absorbed in the bellows 27. As well as the first embodiment, the biasing force F supports the expansion of the bellows 27 and promotes the generation of the vapor V.

In the second embodiment, the bellows 27 can absorb the increased volume amount of the coolant C, as well as the first embodiment.

Direct applying of the external force to the bellows 27 and the spring 29 is suppressed because the cover 40 is provided. In particular, the bellows 27 and the spring 29 easily deform because of the external force in a lateral direction. The damage of the bellows 27 and the spring 29 caused by the external force can be suppressed because the cover 40 protects the bellows 27 and the spring 29.

(Third Embodiment) In the first embodiment and the second embodiment, the spring 29 is used in order to generate the biasing force F applied to the bellows 27. On the other hand, in a third embodiment, a biasing device different from the spring 29 is used.

Figure 9:
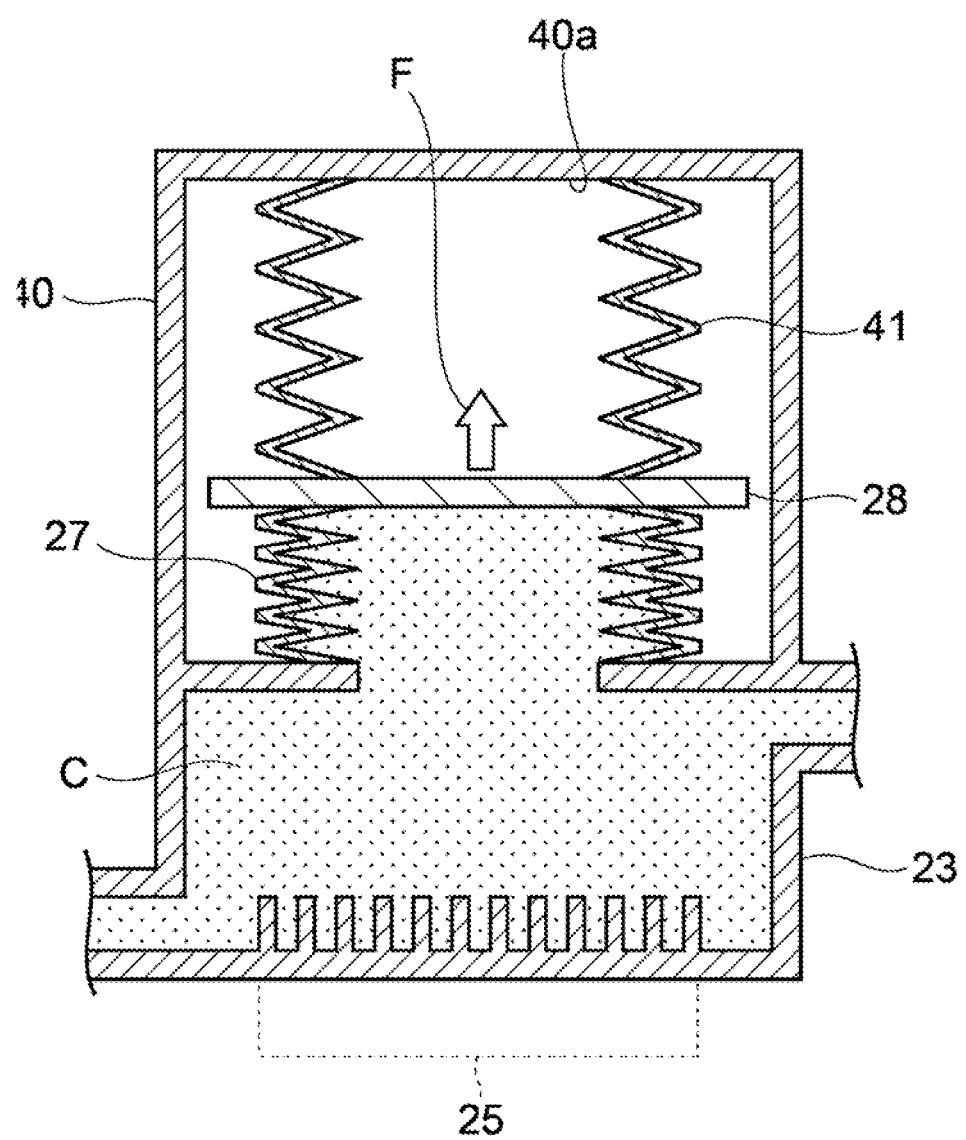
FIG. 9 illustrates a cross sectional view of as bellows and the vicinity in accordance with third embodiment.

FIG. 9 illustrates a cross sectional view of the bellows 27 of the third embodiment and the vicinity.

In FIG. 9, the same numerals are added to the elements as those of the first embodiment and the second embodiment. And explanations of the same elements are omitted.

In FIG. 9, a support bellows 41 is provided between the internal face 40a of the cover 40 and the plate 28. The pressure in the support bellows 41 is lower than the atmospheric pressure. Therefore, contraction force fire contracting the support bellows 41 is generated. As the biasing force F, the contraction force is applied to the bellows 27. The support bellows 41 can support the expansion of the bellows 27 caused by the expansion of the coolant C.

The following diaphragm may be used instead of the support bellows 41.

Figure 10:
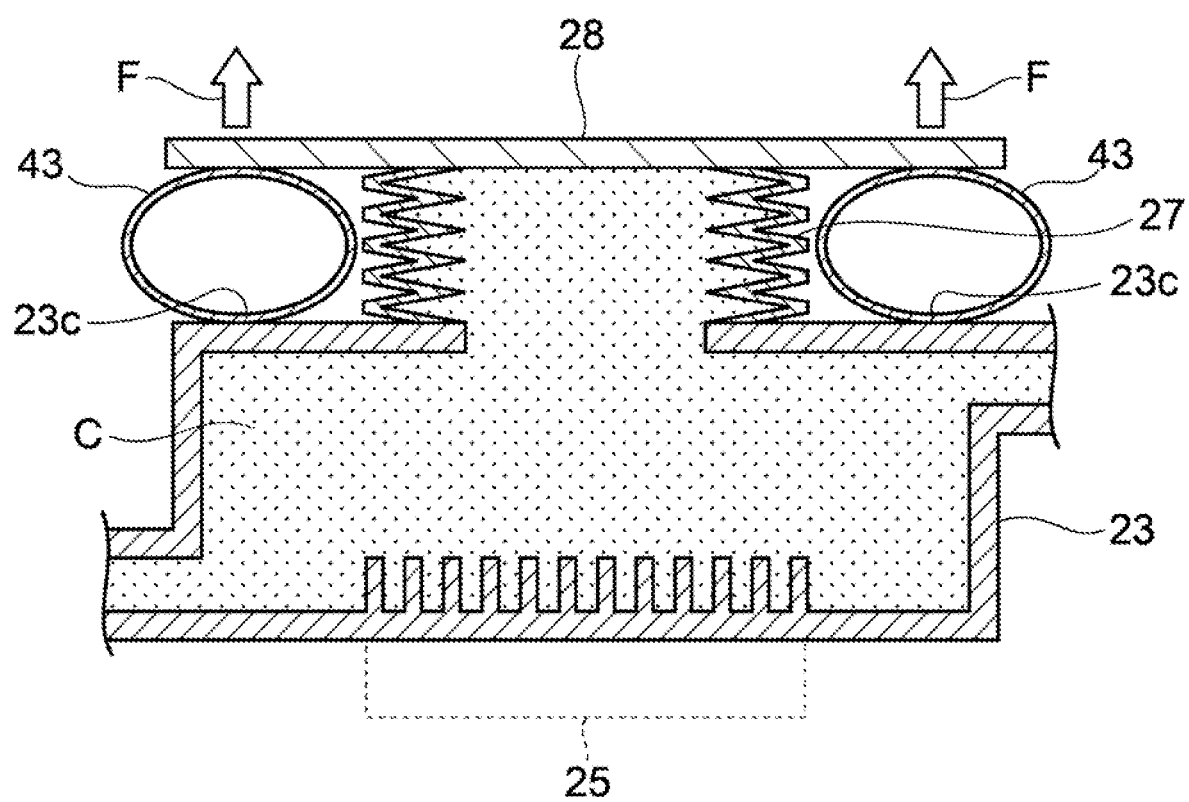
FIG. 10 illustrates a cross sectional view of a bellows and the vicinity in accordance with another example of a third embodiment.

FIG. 10 illustrates a cross sectional view of the bellows 27 in accordance with another embodiment and the vicinity.

In FIG. 10, a diaphragm 43 is provided between the top plate 23c of the evaporator 23 and the plate 28. The diaphragm 43 is a hollow rubber bag of which inner pressure is larger than the atmospheric pressure. Therefore, expansion force for expanding the diaphragm 43 is generated. As the biasing force F, the expansion force is applied to the bellows 27. The support bellows 41 can support the expansion of the bellows 27 caused by the expansion of the coolant C.

(Fourth Embodiment) In the first embodiment to the third embodiment, the bellows 27 is provided in the evaporator 23. The position at which the bellows 27 is provided is not limited. In a fourth embodiment, a description will be given of various examples of the position at which the bellows 27 is provided.

Figure 11A:
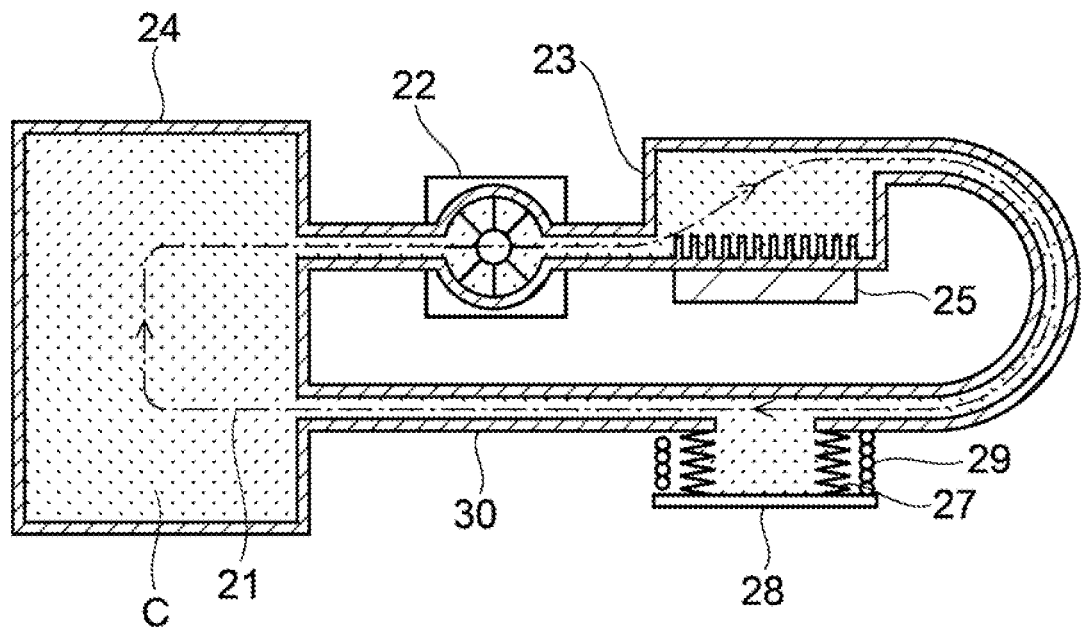
FIG. 11A illustrates a cross sectional view of a cooling system in accordance with a fourth embodiment in a case where a bellows is provided in a circulation passage through which coolant exhausted by an evaporator flows.

FIG. 11A illustrates a cross sectional view of the cooling system 20 in a case where the bellows 27 is provided in the circulation passage 30 through which the coolant C exhausted by the evaporator 23 flows.

Figure 11B:
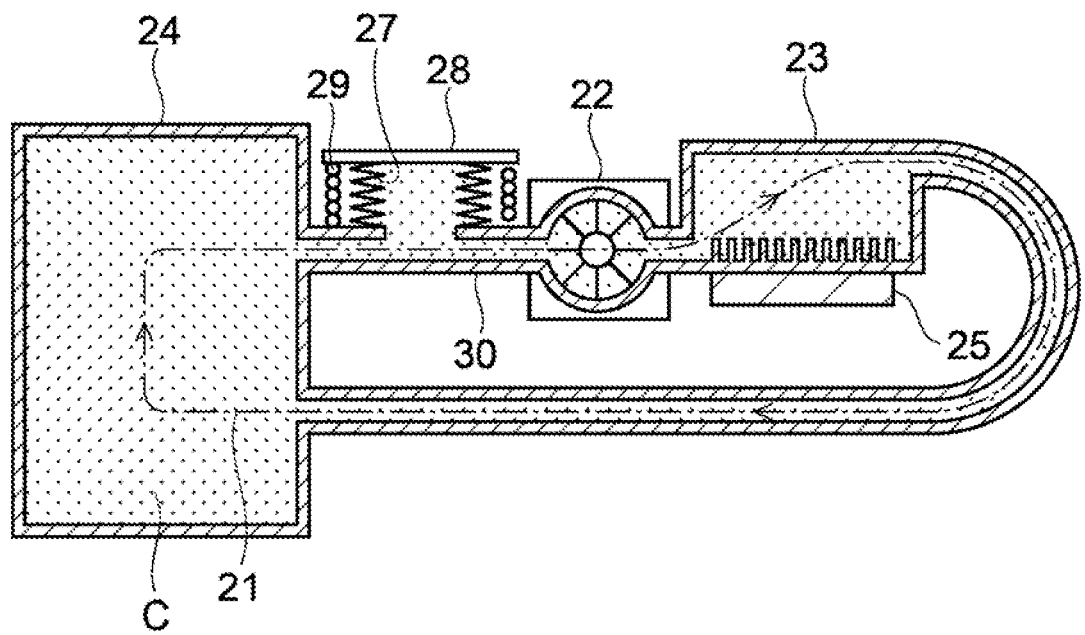
FIG. 11B illustrates a cross sectional view of a cooling system in accordance with a fourth embodiment in which a bellows is provided in a circulation passage through which coolant exhausted by a heat radiator flows.

FIG. 11B illustrates a cross sectional view of the cooling system 20 in which the bellows 27 is provided in the circulation passage 30 through which the coolant C exhausted by the heat radiator 24 flows.

In the cases of the FIG. 11A and FIG. 11B, the bellows 27 can absorb increasing of the volume of the coolant C.

(Fifth Embodiment) In a fifth embodiment, a description will be given of an electronic device in which one of the cooling systems of the first embodiment to the fourth embodiment is included.

Figure 12A:
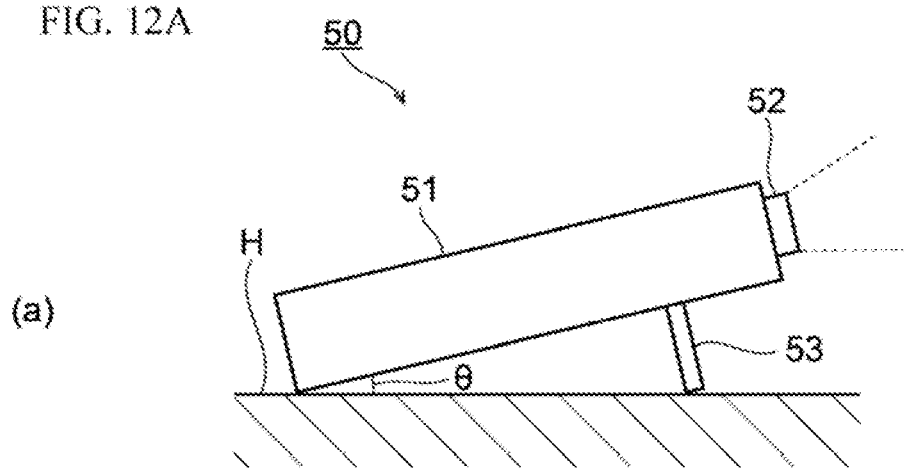
FIG. 12A illustrates a side view of an electronic device in accordance with a fifth embodiment.

FIG. 12A illustrates a side view of the electronic device 50 in accordance with a fifth embodiment.

The electronic device 50 is a portable projector or a projector of which posture can be changed. The electronic device 50 has a frame 51, a projection lens 52 and a leg portion 53.

The projection lens 52 is a lens for projecting a light from inside of the projector a screen. The projection lens 52 is provided on a front face of the frame 51.

The leg portion 53 is a screw mounted on the bottom face of the frame 51. When the screw is rotated, the height of the leg portion 53 is changed. Thus, it is possible to adjust an inclination angle θ of the frame 51 with respect to the horizontal face H.

Figure 12B:
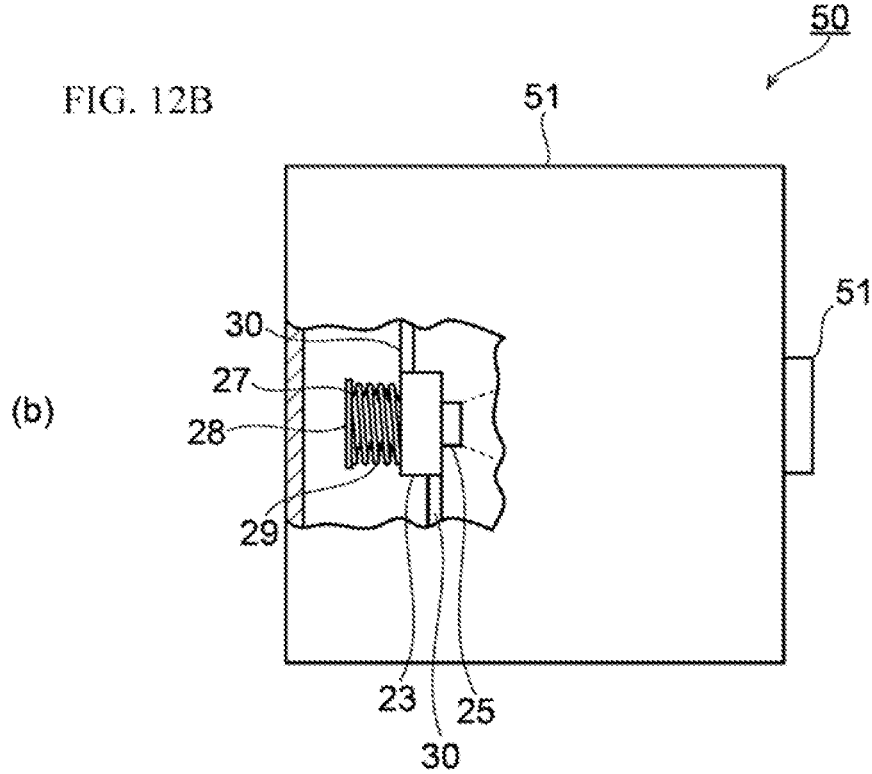
FIG. 12B illustrates a top view of an electronic device in accordance with a fifth embodiment in which a part is cut out.

FIG. 12B illustrates a top view of an electronic device 50 in which a part is cut out.

As illustrated in FIG. 12B, the heating device 25 is housed in the frame 51. The heating device 25 is an LED or an LD acting as a light source in the projector. The heating device 25 is fixed to the evaporator 23 described in the first embodiment.

The bellows 27 is fixed to the evaporator 23. When the temperature of the heating device 25 increases and the volume of the coolant C (illustrated in FIG. 3) increases, the bellows 27 expands. In this case, the bellows 27 can absorb the volume changing of the coolant C.

In the electronic device 50, the inclination angle θ fluctuates in accordance with using situation. In such a case, the idling of the pump 22 is suppressed, when the heat radiator 24 is fully filled with the coolant C. And, the heating device 25 is stably cooled.

Figure 13A:
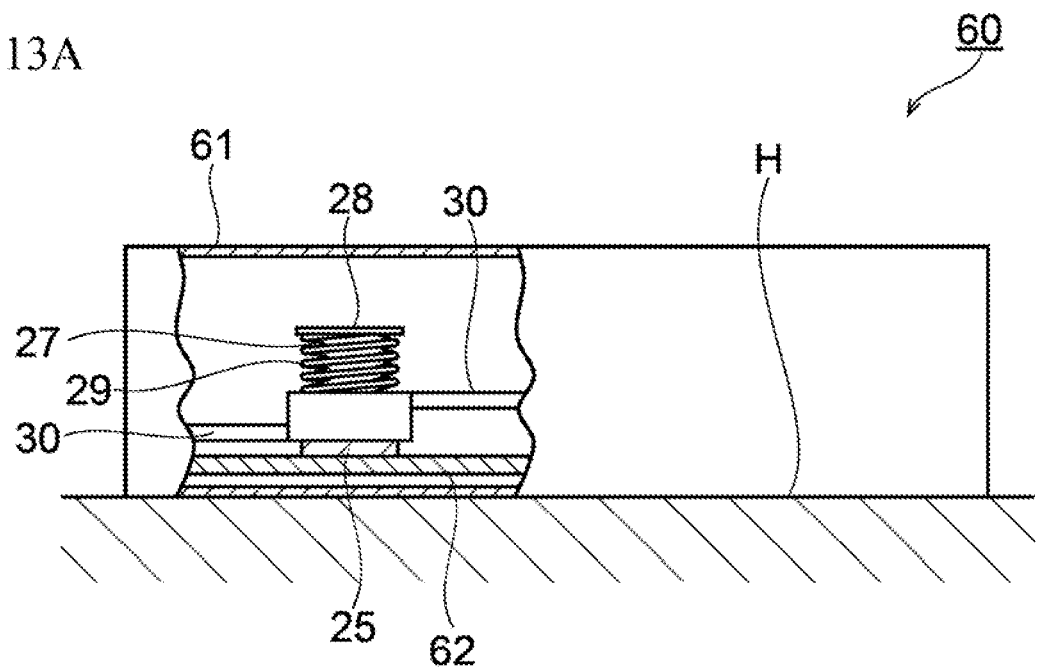
FIG. 13A illustrates a side view of an electronic device in accordance with a fifth embodiment, in which a part is cut out.

FIG. 13A illustrates a side view of an electronic device 60 in accordance with another example of the embodiment, in which a part is cut out.

The electronic device 60 is a generic computer such as a server or a personal computer. The electronic device 60 has a box type frame 61 and a wiring substrate 62 housed in the frame 61. In this case, a CPU or the like mounted on the wiring substrate 62 acts as the heating device 25.

The electronic device 60 is provided on the horizontal face and is used. However, the upside and downside direction of the electronic device 60 is changed in accordance with reasons of a user using the electronic device 60.

Figure 13B:
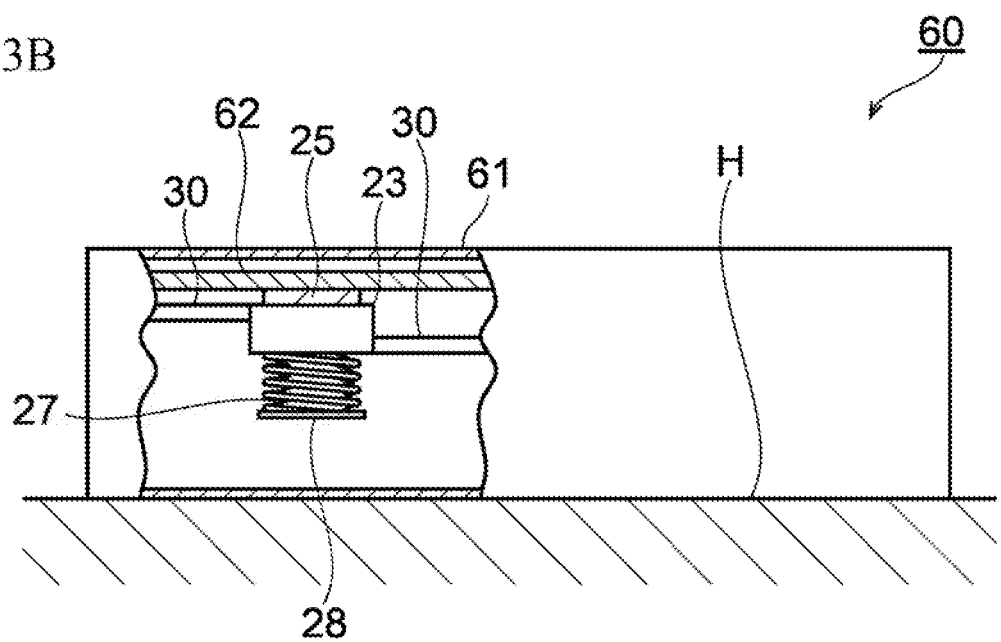
FIG. 13B illustrates a partially-cut-out side view of an electronic device provided on the horizontal thee, in which an upside of the electronic device is turned down.

FIG. 13B illustrates a partially-cut-out side view of the electronic device 60 provided on the horizontal face H. In FIG. 13B, the upside of the electronic device 60 is turned down.

Even if the vertical direction is not fixed in this manner, it is possible to stably cool the heating device 25 by fully filling the heat radiator 24 with the liquid coolant C (illustrated in FIG. 3) as mentioned above. In particular, processors are highly integrated because refining of devices. Therefore, the heat amount of the processors is remarkably increased. When the processor is cooled regardless of the posture of the electronic device 60, the processor sufficiently performs. And convenience of the electronic device 60 is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing, of the superiority and inferiority of the invention. Although the embodiments of the present invention have been described in detail, it should be understood that the various change, substitutions, and alterations could be made hereto without, departing from the spirit and scope of the invention.

What is claimed is:

1. A cooling system comprising:
an evaporator configured to evaporate coolant by receiving heat of a heating device;
a heat radiator configured to radiate heat of the coolant;
a circulation passage through which the coolant circulates between the evaporator and the heat radiator;
a pump that is provided in the circulation passage and is configured to circulate the coolant through the circulation passage; and
an expandable device that is provided in the circulation passage and has expandable inner space into which the coolant flows,
wherein the evaporator, the heat radiator, the circulation passage and the inner space are fully filled with the coolant in a liquid phase.

2. The cooling system as claimed in claim 1, further comprising a biasing device configured to apply biasing force to the expandable device, a direction of the biasing force being a direction for expanding the inner space.

3. The cooling system as claimed in claim 2, wherein the expandable device is a bellows, wherein the biasing device is a spring.

4. The cooling system as claimed in claim 3, wherein a length of the spring is a natural length when the length of the bellows is more than a minimum length and less than a maximum length.

5. The cooling system as claimed in claim 3, further comprising a cover housing the bellows and the spring.

6. The cooling system as claimed in claim 2, wherein
the biasing device is a bellows configured to generate contraction force when pressure in the bellows is lower than an atmospheric pressure, and
as the biasing force, the contraction force is applied to the expandable device.

7. The cooling system as claimed in claim 2, wherein
the biasing device is a diaphragm configured to generate expansion force when pressure in the diaphragm is higher than an atmospheric pressure, and
as the biasing force, the expansion force is applied to the expandable device.

8. The cooling system as claimed in claim 1, wherein pressure in the circulation passage is lower than an atmospheric pressure.

9. The cooling system as claimed in claim 1, wherein the expandable device is provided in the evaporator.

* * * * *